(12) United States Patent
Mach et al.

(10) Patent No.: US 12,289,651 B2
(45) Date of Patent: Apr. 29, 2025

(54) METHOD AND APPARATUS FOR OPTIMIZING UE MOBILITY PERFORMANCE IN WIRELESS COMMUNICATION SYSTEM

(71) Applicant: SAMSUNG ELECTRONICS CO., LTD., Suwon-si (KR)

(72) Inventors: Tomasz Mach, Middlesex (GB); Yue Wang, Middlesex (GB)

(73) Assignee: Samsung Electronics Co., Ltd., Suwon-si (KR)

(*) Notice: Subject to any disclaimer, the term of this patent is extended or adjusted under 35 U.S.C. 154(b) by 441 days.

(21) Appl. No.: 17/825,050

(22) Filed: May 26, 2022

(65) Prior Publication Data
US 2022/0386206 A1 Dec. 1, 2022

Related U.S. Application Data

(63) Continuation of application No. PCT/KR2022/007177, filed on May 19, 2022.

(30) Foreign Application Priority Data

May 26, 2021 (GB) .................................... 2107522
Sep. 20, 2021 (GB) .................................... 2113369

(51) Int. Cl.
H04W 56/00 (2009.01)
H04W 36/22 (2009.01)
(52) U.S. Cl.
CPC .................. H04W 36/22 (2013.01)
(58) Field of Classification Search
CPC .................................................. H04W 36/22
(Continued)

(56) References Cited

U.S. PATENT DOCUMENTS

2011/0098042 A1* 4/2011 Mach .................... H04W 48/20
455/435.1
2011/0151909 A1 6/2011 Kumpula et al.
(Continued)

FOREIGN PATENT DOCUMENTS

| CN | 112583465 A | 3/2021 |
| CN | 112702760 A | 4/2021 |
| WO | 2012-152162 | 11/2012 |

OTHER PUBLICATIONS

"Kovacs et al., Methods and Apparatuses for Testing User Equipment (UE) Machine Learning-Assisted Radio Resource Management (RRM) Functionalities, Sep. 9, 2022, WO 2022186817" (Year: 2021).*

(Continued)

Primary Examiner — Sai Ming Chan
(74) Attorney, Agent, or Firm — Nixon & Vanderhye P.C.

(57) ABSTRACT

The disclosure relates to a 5G or 6G communication system for supporting a higher data transmission rate. The disclosure is to provide a user equipment (UE) in a wireless communication system, the UE comprises a transceiver, and a processor configured to emulate a first event of a set of events related to the set of cells including a first cell and a second cell, estimate a first attribute of a set of attributes of the set of cells based on a result of the emulated first event, determine an emulated first channel load metric of a set of emulated channel load metrics related to the emulated first event, determine an actual first channel load metric of the set of the emulated channel load metrics related to the emulated first event, compare the emulated first channel load metric and the actual first channel load metric, and report, to a base station, a compared result of the emulated first channel load metric and the actual first channel load metric, wherein the (Continued)

emulated first event comprises a cell reselection or handover of the UE from the first cell to the second cell.

16 Claims, 7 Drawing Sheets

(58) Field of Classification Search
USPC .......................................................... 370/332
See application file for complete search history.

(56) References Cited

U.S. PATENT DOCUMENTS

| | | |
|---|---|---|
| 2011/0189989 A1 | 8/2011 | Mach |
| 2015/0181481 A1 | 6/2015 | Masini et al. |
| 2015/0245261 A1 | 8/2015 | Teyeb et al. |
| 2015/0312805 A1 | 10/2015 | Cui et al. |
| 2020/0059809 A1 | 2/2020 | Rahman et al. |
| 2020/0145861 A1* | 5/2020 | Imanilov ............... H04W 24/06 |
| 2020/0314933 A1 | 10/2020 | Tang et al. |
| 2020/0359290 A1 | 11/2020 | Watson et al. |

OTHER PUBLICATIONS

3GPP TR 36.902 V9.3.1, E-UTRAN; Self-configuring and self-optimizing network (SON) use cases and solutions, Mar. 2011, 21 pages.
ORAN-WG3.E2SM-KPM-v01.00.00, "Near-Real-time RAN Intelligent Controller E2 Service Model", 2020, 44 pages.
3GPP TS 38.331 V16.4.1 "NR; Radio Resource Control (RRC) protocol specification", Mar. 2021, 949 pages.
3GPP TS 38.304 V16.4.0, NR; "User Equipment (UE) procedures in Idle mode and RRC Inactive state", Mar. 2021, 39 pages.
3GPP TS 38.133 V16.7.0, "Requirements for support of radio resource management", Mar. 2021, 48 pages.
T. Mach, "Autonomously Controlled Terminal Mobility in Self-Organising Radio Access Network" PhD thesis, University of Surrey, Apr. 2014, 124 pages.
3GPP TS 37.320 V16.4.0, "Radio measurement collection for Minimization of Drive Tests (MDT); Overall description; Stage 2", Mar. 2021, 35 pages.
ORAN-WG3.E2SM-KPM-v01.00.00, "O-RAN Working Group 3 Near-Real-time RAN Intelligent Controller E2 Service Model", 2020, 44 pages.
Combined Search and Examination Report for GB2113369.9 dated May 23, 2022, 13 pages.
Search Report issued Aug. 18, 2022 in counterpart International Patent Application PCT/KR2022/007177.
Written Opinion issued Aug. 18, 2022 in counterpart International Patent Application PCT/KR2022/007177.
Wei, Zhenzhen, "Mobility Robustness Optimization based on UE mobility for LTE system," 2010 International Conference on Wireless Communications & Signal Processing (WCSP), Nov. 11, 2010, 7 pages.
Extended European Search Report dated Sep. 30, 2024 for EP Application No. 22811570.5.

* cited by examiner

METHOD AND APPARATUS FOR OPTIMIZING UE MOBILITY PERFORMANCE IN WIRELESS COMMUNICATION SYSTEM

CROSS-REFERENCE TO RELATED APPLICATIONS

This application is a continuation of International Application No. PCT/KR2022/007177 designating the United States, filed on May 19, 2022, in the Korean Intellectual Property Receiving Office and claiming priority to to Great Britain Patent Application No. 2107522.1, filed on May 26, 2021, and Great Britain Patent Application No. 2113369.9, field on Sep. 20, 2021, in the Great Britain Intellectual Property Office, the disclosures of all of which are incorporated herein by reference in their entireties.

BACKGROUND

1. Field

The disclosure relates to networks and methods thereof.

2. Description of Related Art 5G mobile communication technologies define broad frequency bands such that high transmission rates and new services are possible, and can be implemented not only in "Sub 6 GHz" bands such as 3.5 GHz, but also in "Above 6 GHz" bands referred to as mmWave including 28 GHz and 39 GHz. In addition, it has been considered to implement 6G mobile communication technologies (referred to as Beyond 5G systems) in terahertz bands (for example, 95 GHz to 3 THz bands) in order to accomplish transmission rates fifty times faster than 5G mobile communication technologies and ultra-low latencies one-tenth of 5G mobile communication technologies.

At the beginning of the development of 5G mobile communication technologies, in order to support services and to satisfy performance requirements in connection with enhanced Mobile BroadBand (eMBB), Ultra Reliable Low Latency Communications (URLLC), and massive Machine-Type Communications (mMTC), there has been ongoing standardization regarding beamforming and massive MIMO for mitigating radio-wave path loss and increasing radio-wave transmission distances in mmWave, supporting numerologies (for example, operating multiple subcarrier spacings) for efficiently utilizing mmWave resources and dynamic operation of slot formats, initial access technologies for supporting multi-beam transmission and broadbands, definition and operation of BWP (BandWidth Part), new channel coding methods such as a LDPC (Low Density Parity Check) code for large amount of data transmission and a polar code for highly reliable transmission of control information, L2 pre-processing, and network slicing for providing a dedicated network specialized to a specific service.

Currently, there are ongoing discussions regarding improvement and performance enhancement of initial 5G mobile communication technologies in view of services to be supported by 5G mobile communication technologies, and there has been physical layer standardization regarding technologies such as V2X (Vehicle-to-everything) for aiding driving determination by autonomous vehicles based on information regarding positions and states of vehicles transmitted by the vehicles and for enhancing user convenience, NR-U (New Radio Unlicensed) aimed at system operations conforming to various regulation-related requirements in unlicensed bands, NR UE Power Saving, Non-Terrestrial Network (NTN) which is UE-satellite direct communication for providing coverage in an area in which communication with terrestrial networks is unavailable, and positioning.

Moreover, there has been ongoing standardization in air interface architecture/protocol regarding technologies such as Industrial Internet of Things (IIoT) for supporting new services through interworking and convergence with other industries, IAB (Integrated Access and Backhaul) for providing a node for network service area expansion by supporting a wireless backhaul link and an access link in an integrated manner, mobility enhancement including conditional handover and DAPS (Dual Active Protocol Stack) handover, and two-step random access for simplifying random access procedures (2-step RACH for NR). There also has been ongoing standardization in system architecture/service regarding a 5G baseline architecture (for example, service based architecture or service based interface) for combining Network Functions Virtualization (NFV) and Software-Defined Networking (SDN) technologies, and Mobile Edge Computing (MEC) for receiving services based on UE positions.

As 5G mobile communication systems are commercialized, connected devices that have been exponentially increasing will be connected to communication networks, and it is accordingly expected that enhanced functions and performances of 5G mobile communication systems and integrated operations of connected devices will be necessary. To this end, new research is scheduled in connection with eXtended Reality (XR) for efficiently supporting AR (Augmented Reality), VR (Virtual Reality), MR (Mixed Reality) and the like, 5G performance improvement and complexity reduction by utilizing Artificial Intelligence (AI) and Machine Learning (ML), AI service support, metaverse service support, and drone communication.

Furthermore, such development of 5G mobile communication systems will serve as a basis for developing not only new waveforms for providing coverage in terahertz bands of 6G mobile communication technologies, multi-antenna transmission technologies such as Full Dimensional MIMO (FD-MIMO), array antennas and large-scale antennas, meta-material-based lenses and antennas for improving coverage of terahertz band signals, high-dimensional space multiplexing technology using OAM (Orbital Angular Momentum), and RIS (Reconfigurable Intelligent Surface), but also full-duplex technology for increasing frequency efficiency of 6G mobile communication technologies and improving system networks, AI-based communication technology for implementing system optimization by utilizing satellites and AI (Artificial Intelligence) from the design stage and internalizing end-to-end AI support functions, and next-generation distributed computing technology for implementing services at levels of complexity exceeding the limit of UE operation capability by utilizing ultra-high-performance communication and computing resources.

Cellular networks are increasingly expected to support reliable delivery for mission critical services such as Ultra-Reliable-Low-Latency Communication (URLLC) and V2X. However, networks still experience variations in a connection quality and throughput due to the fast UE mobility, so ensured reliable delivery of messages can be impacted by poor performance of UE mobility control in RRC (L3 protocol). Hence, there is a need to improve networks.

SUMMARY

Embodiments of the disclosure provide a network, a UE and a method which at least partially obviates or mitigates at least some of the disadvantages of the prior art, whether identified herein or elsewhere.

Embodiments of the disclosure provide a method and apparatus for optimizing UE mobility performance efficiently in a wireless communication system.

Embodiments of the disclosure provide a network defining a set of cells, including a first cell and a second cell, wherein the network comprises a set of user equipment, UE, including a first UE, wherein the first UE is configured to emulate a first event of a set of events related to the set of cells, and estimate a first attribute of a set of attributes of the set of cells based on a result of the emulated first event.

Embodiments of the disclosure provide a user equipment, UE, configured to emulate a first event of a set of events related a set of cells, including a first cell and a second cell, defined by a network, and estimate a first attribute of a set of attributes of the set of cells based on a result of the emulated first event.

Embodiments of the disclosure provide a method comprising: emulating, by a first user equipment, UE, of a set of UE, a first event of a set of events related a set of cells, including a first cell and a second cell, defined by a network, and estimating, by the first UE, a first attribute of a set of attributes of the set of cells based on a result of the emulated first event.

Embodiments of the disclosure provide a network defining a set of cells, including a first cell and a second cell, wherein the network comprises a set of user equipment, UE, including a first UE, wherein the network is configured to emulate a first event of a set of events of the first UE related to the set of cells, and estimate a first attribute of a set of attributes of the set of cells based on a result of the emulated first event.

Embodiments of the disclosure provide a method comprising: emulating, by network, a first event of a set of events related a set of cells, including a first cell and a second cell, defined by the network of a first user equipment, UE, of a set of UE, and estimating, by the network, a first attribute of a set of attributes of the set of cells based on a result of the emulated first event.

Embodiments of the disclosure provide a user equipment (UE) in a wireless communication system, the UE comprises a transceiver, and a processor configured to emulate a first event of a set of events related to the set of cells including a first cell and a second cell, estimate a first attribute of a set of attributes of the set of cells based on a result of the emulated first event, determine an emulated first channel load metric of a set of emulated channel load metrics related to the emulated first event, determine an actual first channel load metric of the set of the emulated channel load metrics related to the emulated first event, compare the emulated first channel load metric and the actual first channel load metric, and report, to a base station, a compared result of the emulated first channel load metric and the actual first channel load metric, wherein the emulated first event comprises a cell reselection or handover of the UE from the first cell to the second cell.

Embodiments of the disclosure provide a method of user equipment (UE) in a wireless communication system, the method comprises emulating, by the UE, a first event of a set of events related a set of cells, including a first cell and a second cell, estimating, by the first UE, a first attribute of a set of attributes of the set of cells based on a result of the emulated first event, determining an emulated first channel load metric of a set of emulated channel load metrics related to the emulated first event, determining an actual first channel load metric of a set of the emulated channel load metrics related to the emulated first event, comparing the emulated first channel load metric and the actual first channel load metric, and reporting, to a base station, a compared result of the emulated first channel load metric and the actual first channel load metric, wherein the emulated first event comprises a cell reselection or handover of the UE from the first cell to the second cell.

Embodiments of the disclosure provide a base station in a wireless communication system, the base station comprises a transceiver, and a processor configured to receive, from a user equipment (UE), a compared result of an emulated first channel load metric and an actual first channel load metric, and train a machine learning (ML) algorithm using the compared result, wherein the emulated first channel load metric and the actual first channel load metric are determined based on a set of emulated channel load metrics related to an emulated first event, and wherein the emulated first event comprises a cell reselection or handover of the UE from the first cell to the second cell.

Embodiments of the disclosure provide a method of a base station in a wireless communication system, the method comprises receiving, from a user equipment (UE), a compared result of an emulated first channel load metric and an actual first channel load metric, and training a machine learning (ML) algorithm using the compared result, wherein the emulated first channel load metric and the actual first channel load metric are determined based on a set of emulated channel load metrics related to an emulated first event, and wherein the emulated first event comprises a cell reselection or handover of the UE from the first cell to the second cell.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Figure 1:
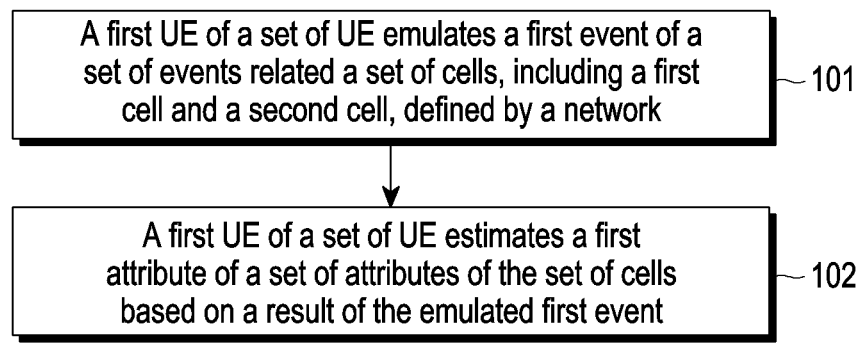
FIG. 1 schematically depicts a method according to an exemplary embodiment.

Advantages and features of the disclosure, and methods for achieving the same may be understood through the embodiments to be described below taken in conjunction with the accompanying drawings. However, the disclosure is not limited to the embodiments disclosed herein, and various changes may be made thereto. The embodiments disclosed herein are provided only to inform one of ordinary skilled in the art of the category of the disclosure.

The blocks in each flowchart and combinations of the flowcharts may be performed by computer program instructions. Since the computer program instructions may be equipped in a processor of a general-use computer, a special-use computer or other programmable data processing devices, the instructions executed through a processor of a computer or other programmable data processing devices generate a system for performing the functions described in connection with a block(s) of each flowchart. Since the computer program instructions may be stored in a computer-available or computer-readable memory that may be oriented to a computer or other programmable data processing devices to implement a function in a specified manner, the instructions stored in the computer-available or computer-readable memory may produce a product including an instruction means for performing the functions described in connection with a block(s) in each flowchart. Since the computer program instructions may be equipped in a computer or other programmable data processing devices, instructions that generate a process executed by a computer as a series of operational steps are performed over the computer or other programmable data processing devices and operate the computer or other programmable data processing devices may provide steps for executing the functions described in connection with a block(s) in each flowchart.

Further, each block may represent a module, segment, or part of a code including one or more executable instructions for executing a specified logical function(s). Further, in some replacement execution examples, the functions mentioned in the blocks may occur in different orders. For example, two blocks that are consecutively shown may be performed substantially simultaneously or in a reverse order depending on corresponding functions.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements. Various combinations of optional features have been described herein, and it will be appreciated that described features may be combined in any suitable combination. In particular, the features of any one example embodiment may be combined with features of any other embodiment, as appropriate, except where such combinations are mutually exclusive. Throughout this specification, the term "comprising" or "comprises" means including the component(s) specified but not to the exclusion of the presence of others. A unit may be configured in a storage medium that may be addressed or may be configured to reproduce one or more processors. For example, a 'unit' includes elements, such as software elements, object-oriented software elements, class elements, and task elements, processes, functions, attributes, procedures, subroutines, segments of program codes, drivers, firmware, microcodes, circuits, data, databases, data architectures, tables, arrays, and variables.

A function provided in an element or a unit may be combined with additional elements or may be split into sub elements or sub units. Further, an element or a unit may be implemented to reproduce one or more central processing units (CPUs) in a device or a security multimedia card. A "unit" may include one or more processors.

Herein, a base station may be an entity allocating a resource to a UE and may include a gNode B (gNB), an evolved Node B (eNode B or eNB), a Node B, a wireless access unit, a base station controller, a transmit point (TP), a TRP, or a node over a network. The base station may be a network entity including an integrated access and backhaul-donor (IAB-donor), which is a gNB providing network access to UEs through a network of backhaul and access links in a new radio (NR) system, and an IAB-node, which is a RAN node supporting NR backhaul links to the IAB-donor or another IAB-node and supporting NR access links to UEs. The UE is wirelessly connected through the IAB-node and may transmit/receive data to and from the IAB-donor connected with at least one IAB-node through the backhaul link.

A user equipment (UE) may include a terminal, a mobile station (MS), a cellular phone, a smartphone, a computer, or a multimedia system capable of performing communication functions, but is not limited to the above examples.

The disclosure relates to a 5G system for supporting a higher data rate than that of a 4G system. The disclosure can be applied for intelligent services based on 5G communication technology and Internet of things (IoT) related technology (e.g., smart homes, smart buildings, smart cities, smart cars or connected cars, healthcare, digital education, retail businesses, security and safety related services, etc.).

Further, the embodiments may be modified in such a range as not to significantly depart from the scope of the disclosure under the determination by one of ordinary skill in the art and such modifications may be applicable to other communication systems, such as LTE or LTE-advanced (LTE-A) or 5G system.

For ease of description, some of the terms and names defined in the 3rd generation partnership project (3GPP) LTE or 5G system standards may be used. However, the disclosure is not limited by such terms and names and may be likewise applicable to systems conforming to other standards.

As a representative example of such a broadband wireless communication system, an LTE system adopts orthogonal frequency division multiplexing (OFDM) for downlink (DL) and single carrier frequency division multiple access (SC-FDMA) for UL. The UL may refer to a radio link in which the UE transmits data or control signals to the base station (e.g., eNode B), and the DL refers to a radio link through which the base station transmits data or control signals to the UE. Such a multiple access scheme allocates and operates time-frequency resources carrying data or control information per user not to overlap, i.e., to maintain orthogonality, thereby differentiating each user's data and/or control information.

Post-LTE communication systems, e.g., 5G system, should simultaneously support various requirements from users and service providers. Services considered for 5G system include enhanced mobile broadband (eMBB), massive machine type communication (MMTC), and ultra-reliability low latency communication (URLLC).

eMBB is intended to provide a further enhanced data transmission rate as compared with LTE, LTE-A, or LTE-pro. For example, eMBB for 5G system should provide a peak data rate of 20 Gbps on DL and a peak data rate of 10 Gbps on UL in terms of one base station.

5G system should also provide an increased user perceived data rate while simultaneously providing such peak data rate. To meet such requirements, various transmit (TX)/receive (RX) techniques, as well as MIMO, may need to further be enhanced. While LTE adopts a TX bandwidth up to 20 MHz in the 2 GHz band to transmit signals, a 5G communication system employs a broader frequency bandwidth in a frequency band ranging from 3 GHz to 6 GHz or more than 6 GHz in order to meet the data rate required for 5G communication systems.

With future cellular networks expected to support new services with stringent reliability, availability, latency and/or throughput requirements, resulting in an increasing system complexity, the ability to comprehensively and cost-efficiently optimize critical radio resource control functions in an open and virtualized cloud-native network environment has become an essential requirement for some use cases. For example, in Vehicle-to-everything (V2X) communications, as cars travel on a motorway with high speed in non-homogenous environment, the cars may experience suboptimal cell handovers and reselections causing mobility impairments, V2X applications and the system performance decrease. To address this challenge, the role of Artificial Intelligence (AI) in mobile networks has increased towards fully native function allowing network self-optimization as defined in 5G Open Radio Access Network (O-RAN) architecture. The inventors have analysed a problem caused by a misalignment between the network controlled and the User Equipment (UE) controlled mobility functions defined in 3GPP New Radio (NR) Radio Resource Control (RRC) protocol and introduced solution comprising a novel framework using UE cell reselection mechanisms emulation in the RRC_CONNECTED state to support V2X mobility robustness optimization. The disclosure has also demonstrated how the solution may provide optimisation data for AI mechanisms available in the O-RAN system.

Cellular networks are increasingly expected to support reliable delivery for mission critical services such as Ultra-Reliable-Low-Latency Communication (URLLC) and V2X. However, networks still experience variations in a connection quality and throughput due to the fast UE mobility, so ensured reliable delivery of messages can be impacted by poor performance of UE mobility control in RRC (L3 protocol).

In an effort to counteract these variations, various RAN self-organisation mechanisms such as Mobility Robustness Optimisation (MRO) have been defined in 3GPP standard [referring to 3GPP TR 36.902 V9.3.1 (2011 March) 'E-UTRAN; Self-configuring and self-optimizing network (SON) use cases and solutions' (hereinafter, TR 36.902]. Preliminary efforts covered a limited number of use cases, with more work expected to better address new and challenging scenarios such as V2X and considering increasing AI role in the network. This disclosure focuses on a novel approach to optimize UE controlled mobility (cell reselection) used in 3GPP NR RRC_IDLE and RRC_INACTIVE states [referring to 3GPP TS 38.331 V16.4.1 (2021 March) 'NR; Radio Resource Control (RRC) protocol specification' (hereinafter, TS 38.331)]. This novel approach is compared with a network controlled cell handover (HO) mechanism used in the RRC_CONNECTED state leading to the identification of the performance impacting coverage misalignment problem between both functions. In addition, the inventors have defined a new MRO use case and a solution framework in O-RAN to address it.

This disclosure provides a novel approach to automatically optimize UE mobility performance in a wireless communication system. There are two mobility procedures defined in 3GPP mobile systems:

Cell handover (network controlled mobility); and
Cell reselection (UE controlled mobility based on the network configuration).

The disclosure leverages similarities between a network controlled handover (HO) mechanism used in 3GPP 5G NR (but also in 4G and 3G) Radio Resource Control (RRC) protocol connected state (aka mode) and a User Equipment (UE) controlled cell reselection procedure used in the idle and inactive states. Description herein is focused on the idle state and applies to the inactive state mutatis mutandis.

While the differences between the cell reselection and the handover could cause some degradation in the system performance and the user experience (e.g. see Mobility Robustness Optimisation (MRO) use case in 3GPP Self Organising Network (SON) defined in [TR 36.902]), the similarities allow defining and introducing new optimisation framework to address it. Apart from MRO, the solution could apply to other network optimisation use cases such as mobility load balancing, coverage and capacity trade-off and inter-frequency and inter-RAT mobility robustness optimisation.

Suboptimal mobility configuration may result in a degraded user service quality. State of the art work identified a detection of late/early/wrong cell HO, optimization of cell reselection parameters and also reduction of inefficient use of network resources due to unnecessary HOs as examples of MRO use cases. Undesired HOs subsequent to the RRC connection establishment (after transition from idle to connected state [referring to TS 38.331]) could be caused by the poor alignment of the cell reselection settings with the HO configuration and should be avoided as they may generate extra radio interface signaling, reducing efficiency and increasing data transmission delay which is critical for V2X services. The disclosure addresses inter alia the problem of unwanted HOs after leaving the RRC_IDLE state by the optimization of the reselection configuration using self-organising approach.

In more detail, incorrect mobility parameters configuration can deteriorate service, network performance and user experience by causing mobility ping-pongs and failures e.g. Radio Link Failure. Suboptimal mobility settings could decrease service performance e.g. by prolonged association with the non-optimal cell (too late HO or cell reselection) or too early HO or cell reselection especially for fast moving UEs such as those supporting Vehicle-to-Everything (V2X) services. In addition, manual optimization of the mobility parameters after the initial deployment is often time consuming and costly for the mobile network operator. Proposed optimisation framework (which may insignificantly increase processing, signaling and power consumption requirements in the UE due to the new cell reselection emulation function) could be especially suitable for V2X UEs due to their often less stringent power saving requirements e.g. than battery powered mobile phones.

One example of the related mobility problem is the difference between cell associations of a terminal during the mobility between two cells, resulting in a coverage misalignment between both RRC states. Such misalignment may have a negative system performance impact during the connection setup process, in terms of the unnecessary control plane signaling and data latency as described in [TR 36.902]:

'Additionally cell-reselection parameters not aligned with HO parameters may result in unwanted handovers subsequent to connection setup, which should be avoided by parameter adjustments done by MRO function.'

To reduce the misalignment, the network, method and UE described herein allow adjusting a cell reselection decision with the handover decision. Furthermore, a new optimisation algorithm is described, using cell measurements reporting to support mobility robustness in Self-Organizing Network (SON) or AI assisted Network to improve the user experience.

The disclosure addresses the problem of lack of joint optimisation of two separate functions of RRC protocol—cell handover and reselection supporting UE mobility. It enables real-time optimisation of the UE mobility in RRC idle state and it could be used, for example, for:

Detecting poor UE mobility performance; and/or

Generating and gathering new information and statistics about the UE mobility performance e.g. for self-organising or AI assisted network algorithms; and/or Joint cell reselection and handover (cross RRC state) mobility performance optimisation by dynamically adjusting cell reselection or handover configuration; and/or Defining corresponding control plane architecture to support such optimisations.

In NR idle and inactive states, mobility is UE controlled [referring to TS 38.331]. To support it, a UE periodically using discontinuous reception cycle configured by the network performs serving and neighbour cells measurements before making a reselection decision to maintain service continuity. Based on the ranking of the cells derived from the signal quality (RSRQ) and/or power (RSRP), the UE triggers the cell reselection procedure [referring to 3GPP TS 38.304 V16.4.0 (2021 March) 'NR; User Equipment (UE) procedures in Idle mode and RRC Inactive' (hereinafter, TS 38.304)] to a better ranked cell if available.

In NR connected state, the UE needs to perform cell measurements (RSRP and/or RSRQ) and based on them may trigger and report network configurable measurement event such as event A3—'Neighbour better than Primary Cell' [referring to TS 38.331] to initiate a network controlled handover decision. To better control event reporting behaviour in the UE, the network uses supporting parameters such as Time-to-trigger (0-5120 ms range), hysteresis and/or offset (there are corresponding cell reselection parameters defined although their ranges and granularities vary e.g. Treselection range 0-7 s) [referring to TS 38.331]. Based on the event A3 reporting (or other similar predefined events), the network could be aware of the current serving and neighbour cells ranking in the UE and based on this information, is able to precisely control the cell handover decision triggered by RRC taking into account cell load if needed.

A main difference between cell measurements in the idle and connected states is the minimum measurements frequency in L3 i.e. every 1.28 s Discontinuous Reception Cycle (other possible values 0.32 s, 0.64 s, 2.56 s) in the idle state for the UE energy saving purpose and 200 ms minimum measurement period for intra-frequency measurements in the connected state [referring to 3GPP TS 38.133 V16.7.0 (2021 April) 'NR; Requirements for support of radio resource management' (hereinafter, TS 38.133)]. Another difference is the Averaging Layer 3 filter—optionally configured by the network in the connected state to increase the event A3 evaluation reliability [referring to TS 38.331]. Physical layer (L1) measurements details are implementation specific as long as minimum performance requirements are fulfilled [referring to TS 38.133].

Figure 2:
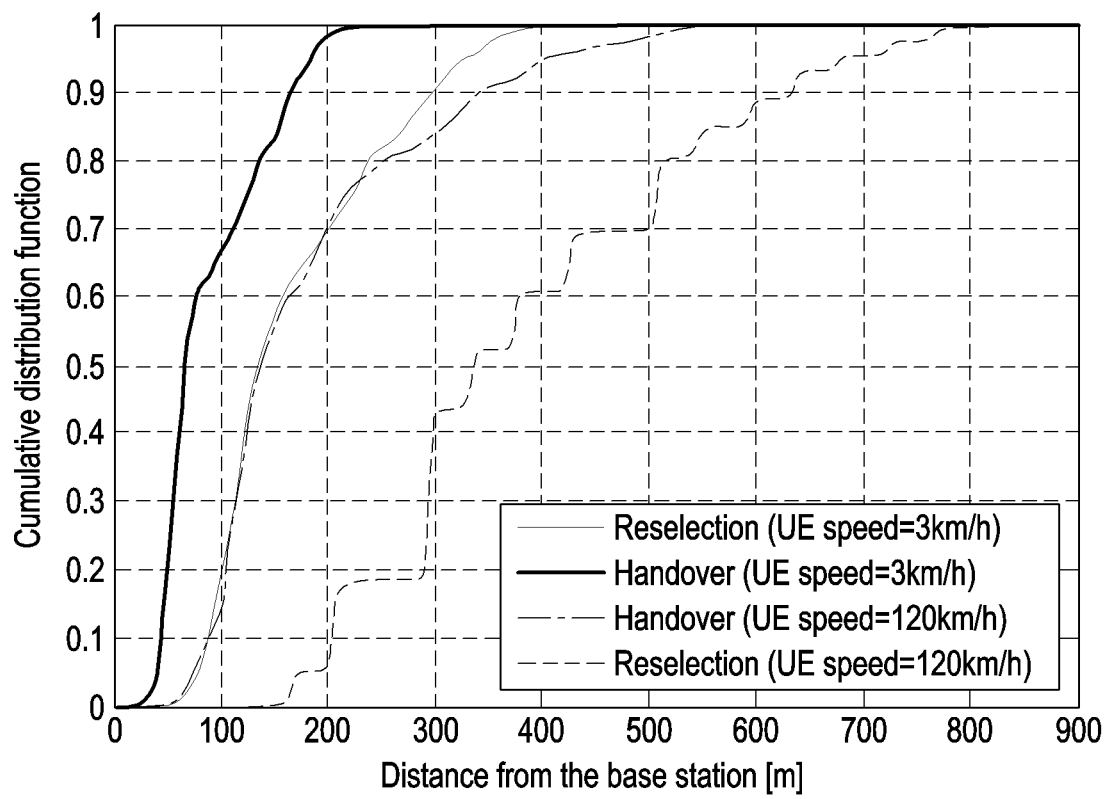
FIG. 2 is a graph showing CDF of the distance from the base station during idle and connected states mobility in 3G for low and high mobility scenario.

From the cell coverage planning point of view, the above mentioned differences in cell measurements between idle and connected states may cause a cell association difference during UE mobility, resulting in a coverage misalignment between both states (see simulation example on FIG. 2 which shows the problem becomes more critical for high mobility scenario such as V2X). Such misalignment could be a reason of the abovementioned unwanted HO e.g. when a need to transfer user data triggers RRC connection establishment in the misalignment area negatively impacting system performance by increased RRC signaling and data latency. Reduction of the misalignment area e.g. by adjusting reselection parameters could improve the system performance FIG. 2 shows a graph showing CDF of the distance from the base station during idle and connected states mobility in 3G for low and high mobility scenario, for example, for cell reselection and handover at UE speeds of 3 km/h and 120 km/h, respectively (adapted from [Mach, T. H. 'Autonomously Controlled Terminal Mobility in Self-Organising Radio Access Network' PhD thesis (Univ. of Surrey, 2014) https://epubs.surrey.ac.uk/855850/]).

Reference Signal Strength Indicator (RSSI), Reference Signals Received Power (RSRP) and Reference Signal Received Quality (RSRQ) are measures of signal level and quality for mobile networks, such as LTE networks. In mobile networks, when a UE moves from cell to cell and performs cell selection/reselection and handover, the UE preferably measures the signal strength/quality of the neighbour cells.

Reference Signal Received Power (RSRP) is a Received Signal Strength Indicator (RSSI) type of measurement. RSRP is the power of the LTE Reference Signals spread over the full bandwidth and narrowband. A minimum of −20 dB SINR (of the S-Synch channel) is needed to detect RSRP/RSRQ. Generally, QoS increases if RSRP increases while QoS decreases if RSRP decreases.

Reference Signal Received Quality (RSRQ) is the quality considering also RSSI and the number of used Resource Blocks (N) RSRQ=(N*RSRP)/RSSI measured over the same bandwidth. RSRQ is a carrier to interference (C/I) type of measurement and it indicates the quality of the received reference signal. The RSRQ measurement provides additional information when RSRP is not sufficient to make a reliable handover or cell reselection decision, for example. Generally, QoS increases if RSRQ increases while QoS decreases if RSRQ decreases.

Generally, the latency is a time delay in data transmission between one node and another node. In mobile communications, two different types of latency may be measured: C-Plane latency and U-Plane latency. In one example, the first channel load metric comprises C-Plane latency and/or U-Plane latency. Generally, QoS increases if the latency decreases while QoS decreases if the latency increases.

Generally, QoS increases if the bitrate increases while QoS decreases if the bitrate decreases.

Generally, QoS increases if the data buffer occupancy rate decreases while QoS decreases if the data buffer occupancy rate increases.

The novel framework is based on the fact that an existing connected state HO event (such as event A3) and optionally its configuration parameters may be mapped to the corresponding idle state cell reselection event and optionally its parameters. By using this approach, the UE in the connected state is able to emulate the idle state cell reselection behaviour in parallel to the ongoing normal connected state cell measurements activity. Such emulation uses the same UE serving and neighbour cells measurements performed in the connected state for the handover but adapted to reflect idle state mobility behaviour e.g. by reducing their frequency, disabling L3 filter if configured etc. These emulated idle state measurements may be then used to evaluate and trigger "artificial" cell reselection in parallel with the normal handover evaluation performed in the connected state (dual HO and cell reselection evaluation). This approach enables the UE to detect and estimate the coverage misalignment severity (e.g. measured by a RSRQ and/or RSRP difference between the actual handover and the emulated reselection) during the mobility between two neighbour cells which may be reported to the network for MRO purpose. Gathering such data may be later processed by AI assisted analytics mechanisms available in O-RAN architecture (e.g., through E2SM-KPM [referring to O-RAN Working Group 3 Near-Real-time RAN Intelligent Controller E2 Service Model (E2SM) KPM, ORAN-WG3.E2SM-KPM-v01.00.00]) to reduce the coverage misalignment by adjusting the reselection configuration. In essence, a recent development in O-RAN has provided the near-RT RIC "RAN control" RAN Function, which can support control services in both connected state mobility and idle state mobility. For connected state mobility, the control services are used to control operations of Handover (HO), Conditional handover (CHO), Dual Active Protocol Stack (DAPS) HO, while for the idle state mobility control, the control service is used for modification of intra-frequency, inter-frequency, inter-RAT cell reselection priority, idle timers [O-RAN WG3 Near-Real-time RAN Intelligent Controller E2 Service Model (E2SM), RAN Control, 2021]. The new framework can therefore be viewed as part of such RAN control service model, to address the misalignment of the RRC state mobility and may be mapped to ORAN.

Figure 3:
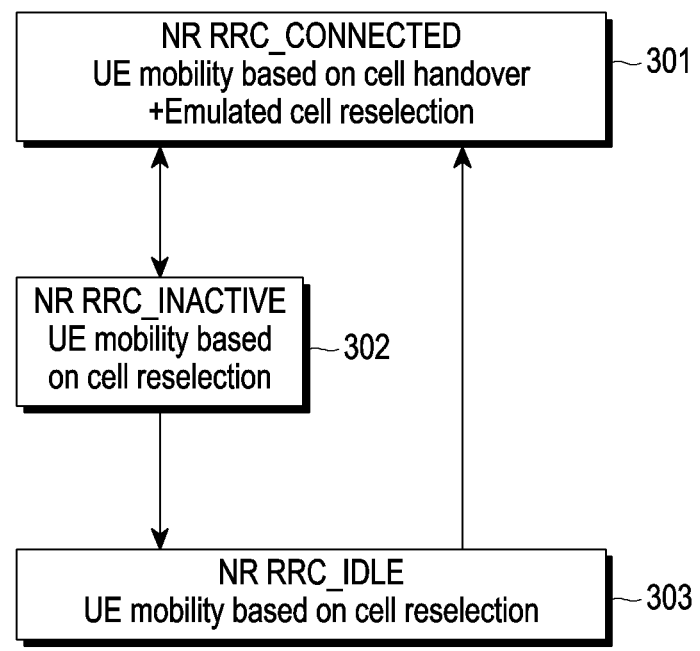
FIG. 3 schematically depicts a 3GPP NR RRC UE state machine extended with emulated cell reselection.

In more detail, this disclosure introduces emulated cell reselection function in the NR RRC_CONNECTED state to enable joint cross-state mobility optimisation (not possible in the state of the art approaches)—see FIG. 3.

FIG. 3 schematically depicts a 3GPP NR RRC UE state machine extended with emulated cell reselection (adapted from [TS 38.331]).

In more detail, FIG. 3 depicts the UE state machine (please note UE state needs to be reflected on the NW side i.e. UE and NW protocol state machines need to be in sync) based on [TS 38.331] extended with the emulated cell reselection function (see in italics). Based on the input from the UE(s) (see Section 1.2), the disclosure leverages extended state machine in the connected state to minimise RSRP_difference at the network.

It leverages common characteristics of both RRC connected and idle/inactive states in terms of three main mechanisms (301, 302 and 303 in FIG. 3) required for the UE mobility as defined in [TS 38.331] and summarized in Table 1. The following Table 1 represents commonalities between NR RRC states and mechanisms required for the UE mobility. It is noted from the Table 1 that system information can be acquired in both RRC_IDLE/RRC_INACTIVE and RRC_CONNECTED state based on receiving broadcasted system information for the serving cell. Because of the availability of such system information (including cell measurements control information) and the UE ability to perform similar neighbouring cell measurements to support mobility when the UEs are at the RRC_CONNECTED state, the cell reselection (idle state behaviour) in the RRC_CONNECTED state can be replicated.

TABLE 1

| RRC_IDLE/RRC_INACTIVE state | RRC_CONNECTED state |
| --- | --- |
| UE controlled mobility based on network configuration (from acquired system information)-cell reselection | Network controlled mobility-cell handover |
| UE acquires system information which may include as defined in [TS 38.304]:<br>- Measurement control information: cells, frequencies, RATs to be measured and their absolute priorities<br>- Measurement rules for cell reselection: $S_{IntraSearchP}$, $S_{IntraSearchQ}$, $Thresh_{X, HighQ}$, $Thresh_{X, HighP}$, $Thresh_{Serving, LowQ}$, $Thresh_{Serving, LowP}$<br>- Cell selection criterion evaluation parameters: $Q_{rxlevmin}$, $Q_{rxlevminoffset}$, $P_{compensation}$, $Qoffset_{temp}$, $Q_{qualmin}$, $Q_{qualminoffset}$, $Qoffset_{temp}$<br>- Reselection timer: $Treselection_{RAT}$<br>- Cell ranking parameters: $Q_{hyst}$, $Qoffset_{temp}$, $Qoffset$, $Qoffset_{temp}$<br>- Mobility states evaluation parameters: $T_{CRmax}$, $N_{CR\_H}$, $N_{CR\_M}$ and $T_{CRmaxHyst}$<br>- Scaling rules: Speed dependent ScalingFactor for $Q_{hyst}$, Speed dependent ScalingFactor for $Treselection_{NR}$,<br>- Cell status: cellBarred, cellReservedForOperatorUse, cellReservedForOtherUse, cellReservedForFutureUse<br>UE performs neighbouring cell measurements for UE triggered cell reselection | UE acquires system information which as an example for Event A3 may include as defined in [referring to TS 38.331]:<br>- Measurement object specific offset of the reference signal of the neighbour cell (offsetMO)<br>- Cell specific offset of the neighbour cell (i.e. cellIndividualOffset)<br>- Measurement object specific offset of the SpCell (serving cell) (i.e. offsetMO<br>- Cell specific offset of the SpCell (i.e. cellIndividual Offset)<br>- Hysteresis parameter for this event (i.e. hysteresis)<br>- Offset parameter for this event (i.e. a3-Offset)<br>- Time during which specific criteria for the event needs to be met in order to trigger a measurement report (i.e TimeToTrigger)<br>UE performs neighbouring cell measurements and measurement reporting (for network triggered HO) |

Two example solutions are described:

1. UE based, as described under Section 1.1 Mobility optimization framework based on the UE based solution and Section 1.2 Cross-state mobility robustness optimization based on the UE based solution. Even though the cell reselection is normally not performed in the connected state, emulated cell reselection could be performed in the UE 'virtually' (in parallel to the legacy HO mechanisms) using the reselection configuration acquired from the system information and based on the neighbouring cell measurements normally performed in the connected state for the HO (as neighbouring cell measurements are typically performed more frequently in the connected state than in the idle state, their frequency needs to be adopted (filtered) to idle state and emulated reselection requirements). As a result, the UE can detect when the emulated cell reselection is triggered (as if UE was in the idle state) and immediately compare it with the HO triggered in the connected state. Any misalignment between them could be quantified in time or cell measurements domain (see Section 1.2) and then immediately reported to the network for optimization purposes (misalignment minimization) by adjusting mobility parameters such as Hysteresis, Time to Trigger, Cell Individual Offset, or other cell reselection parameters. The parameters related to cell reselection are defined in [TS 38.304] and those related to handover in [TS 38.331]; and 2. Network based, as described under Section 2.1 Cross-state mobility robustness optimization based on the network based solution.

The aspects may comprise one or more of:

1. The extraction of data from the UE in the connected state to optimise parameters for cell-reselection, i.e., idle state parameter;

2. The extraction of data from the UE in the idle state to optimise parameters for handover, i.e., connected state parameter;

3. The aforementioned optimisation can be employed at the network or the UE side, or at a network intelligent entity, e.g., a near-RT RIC in O-RAN;

4. Alignment of corresponding parameter values between cell handover and reselection e.g. TimeToTrigger and Treselection (not fully aligned in [TS 38.331]);

5. Network signaling and protocols to support the above.

FIG. 1 schematically depicts a method according to an exemplary embodiment.

In step 101, the method comprises emulating, by a first user equipment, UE, of a set of UE, a first event of a set of events related a set of cells, including a first cell and a second cell, defined by a network.

In step 102, the method comprises estimating, by the first UE, a first attribute of a set of attributes of the set of cells based on a result of the emulated first event.

The method may include any of the steps as described with respect to the first aspect, the second aspect, the third aspect and/or described herein.

The first aspect provides a network defining a set of cells, including a first cell and a second cell (i.e. the UE serving cell and the neighbour cells), wherein the network comprises:

a set of user equipment, UE, including a first UE (i.e. the UE);

wherein the first UE is configured to:

emulate a first event (e.g. the HO event or the cell reselection event) of a set of events related to the set of cells; and estimate a first attribute (e.g. the coverage misalignment severity) of a set of attributes of the set of cells based on a result of the emulated first event.

In this way, idle state UE mobility is optimised. Particularly, using data obtained from the first UE in the connected state, for example, mobility performance in the network (between the connected and idle/inactive states) is optimised by emulating the first event using the obtained data. As a result, cross state handover-reselection misalignment mobility optimization, for example, is immediately possible, thereby reducing or eliminating latency.

In this example, the emulated first event comprises and/or is a handover, HO, of the first UE from the first cell to the second cell.

In one preferred example, the emulated first event comprises and/or is a cell reselection of the first UE from the first cell to the second cell.

In one example, the first UE is configured to emulate, in a connected state, the first event, wherein the first event is in an idle or inactive state (i.e. cell reselection), for example using data, such as cells measurements as described below, obtained (i.e. extracted) by the first UE in the connected state.

In one example, the first UE is configured to emulate, in an idle or inactive state, the first event, wherein the first event is in a connected state (i.e. handover), for example using data, such as measured as described below, obtained (i.e. extracted) by the first UE in the idle or inactive state.

In one example, the first UE is configured to initiate the first event (e.g. the actual HO event or the actual cell reselection event). In one preferred example, the first UE is configured to initiate the first event, wherein the first event is a cell reselection, of the first UE, from the first cell to the second cell.

In one example, the first UE is configured to initiate the first event (i.e. the actual HO event).

In one example, the first UE is configured to determine, for example measure, an emulated first channel load metric of a set of emulated channel load metrics related to the emulated first event (e.g. the RSRQ and/or RSRP).

In one example, the first UE is configured to determine, for example measure, an actual first channel load metric of a set of channel load metrics related to the initiated first event (e.g. the RSRQ and/or RSRP, in which these emulated idle state measurements may be then used to evaluate and trigger "artificial" cell reselection in parallel with the normal handover evaluation performed in the connected state (dual HO and cell reselection evaluation).

In one example, the first UE is configured to compare the emulated first channel load metric and the actual first channel load metric (e.g. RSRQ and/or RSRP difference between the actual handover and the emulated reselection).

In one example, the first UE is configured to report the compared emulated first channel load metric and the actual first channel load metric (e.g. reported to the network for MRO purpose).

In one example, the network comprises a machine learning, ML, algorithm or SON algorithm and wherein the ML algorithm is trained using the compared emulated first channel load metric and the actual first channel load metric (e.g. such data may be later processed by AI or SON assisted analytics mechanisms available in O-RAN architecture).

In one example, the network is configured to control an operation (e.g. support control services in both connected state mobility and idle state mobility, to control operations of Handover (HO), Conditional handover (CHO), Dual Active Protocol Stack (DAPS) HO, while for the idle state mobility control, the control service is used for modification of intra-frequency, inter-frequency, inter-RAT cell reselection priority, idle timers) thereof using the trained ML algorithm and/or a Self Organising Network, SON, algorithm.

In one example, first UE is configured to emulate the first event as an idle state event (e.g. such emulation uses the same UE serving and neighbour cells measurements performed in the connected state for the handover but adapted to reflect idle state mobility behaviour e.g. by reducing their frequency, disabling L3 filter if configured etc.).

In one example, the first attribute comprises and/or is a coverage misalignment severity.

In one example, the first UE is configured to map an existing state event to a corresponding idle event (i.e. the novel framework is based on the fact that an existing connected state HO event (such as event A3) and optionally its configuration parameters may be mapped to the corresponding idle state cell reselection event and optionally its parameters).

In one example, the first UE is configured to map existing state event parameters to corresponding idle event parameters (i.e. the novel framework is based on the fact that an existing connected state HO event (such as event A3) and optionally its configuration parameters may be mapped to the corresponding idle state cell reselection event and optionally its parameters).

The network according to the first aspect may be configured to implement any of the steps as described with respect to the second aspect, the third aspect and/or described herein.

A second aspect provides a user equipment, UE, configured to:

emulate a first event of a set of events related a set of cells, including a first cell and a second cell, defined by a network; and estimate a first attribute of a set of attributes of the set of cells based on a result of the emulated first event.

The UE according to the second aspect may be configured to implement any of the steps as described with respect to the first aspect, the third aspect and/or described herein.

A third aspect provides a method comprising:

emulating, by a first user equipment, UE, of a set of UE, a first event of a set of events related a set of cells, including a first cell and a second cell, defined by a network; and estimating, by the first UE, a first attribute of a set of attributes of the set of cells based on a result of the emulated first event.

The method according to the third aspect may include any of the steps as described with respect to the first aspect, the second aspect and/or described herein.

To support the mobility performance optimisation based on the cell reselection mechanism, a new approach is proposed. A novel framework is based on the fact, that existing connected state measurement events configuration parameters defined in [TS 38.331] could be mapped to the corresponding idle state cell reselection parameters [TS 38.304]. By using this approach, the UE being in RRC connected state is able to emulate the idle state cell reselection algorithm behaviour in parallel to the ongoing normal connected state measurement activity.

From the implementation point of view, the idea is to use as an input the same serving and neighbour cells measurements performed in the UE for handover based mobility but adapt them, to emulate the typical measurement configuration and behaviour in the idle state. In particular, this would require using measurements before averaging filter is applied (if configured by the network) and reducing their frequency (e.g. from 200 ms (minimum measurement period for intra-frequency measurements in the connected state [referring to TS 38.133]) or less to 1280 ms in the typical system configuration). Based on those emulated idle state measurements, the UE would be able to simultaneously and independently evaluate and trigger normal handover procedure and also the emulated cell reselection behaviour with corresponding hysteresis and offset parameters if configured.

The main benefit of this approach is that it allows the UE to precisely identify and measure the coverage misalignment in the cell change between both mobility behaviours. This information could be valuable from the network point of view and could be used to optimise the network configuration to reduce such misalignment.

The potential optimisation on the network side to reduce the coverage misalignment could include the cell reselection or the handover parameters (e.g. adjustment of the offset parameter). The main novel part of the proposed approach is that the misalignment information extracted from the UE in the connected state is used to increase the mobility robustness by cross-state mobility and coverage optimization in the same time. This data could be then immediately reported to the related SON/AI algorithms performed in the relevant network entities. One of the advantages of this approach, comparing to the legacy approach e.g. UE based measurement logging used in 3GPP Minimization of Drive Test (MDT) [referring to 3GPP TS 37.320 V16.4.0 (2021 March) 'Radio measurement collection for Minimization of Drive Tests (MDT); Overall description; Stage 2' (hereinafter, TS 37.320)], is that it allows faster and more precise misalignment optimisation as the delay between storing the idle state measurements in the UE and reporting them to the network when the UE moves to the connected state (as in MDT) is avoided. Proposed approach is currently not exploited in the existing cellular technologies.

Based on the intra-frequency example (but not limited to, as the framework could be also applied to the inter-frequency and inter-RAT measurements and related mobility procedures), there is a mapping proposed between corresponding connected and idle RRC state measurement configuration parameters presented with some enhancement to support the proposed optimization.

The enhancement is based on the serving and neighbour cells measured signal (RSRP) and quality (RSRQ) measurements performed in the UE during the terminal mobility in connected and idle RRC states. Based on the new concept of emulating the idle state behaviour in the connected state, new optimization method is proposed for Mobility Robustness Optimization function in SON/AI as an example of the application of the proposed framework.

To emulate the idle state cell reselection behaviour in the UE, connected state Event A3 (defined in [TS 38.331] as 'Neighbour better than Primary Cell' (or similar e.g. for interfrequency or inter-RAT mobility) could be used with the following mapping of the configuration parameter values (see Table 2 for more details of the mapping, parameters are defined in [TS 38.331] and [TS 38.304]): The following Table 2 represents mapping between event A3 and cell reselection parameters.

TABLE 2

| RRC_CONNECTED state Event A3 ("Neighbour better than Primary Cell") parameter in [TS 38.331] | RRC_IDLE state Cell reselection parameter in [TS 38.304] |
| --- | --- |
| TimeToTrigger-the time [ms] during which specific criteria for the event needs to be met in order to trigger a measurement report from UE to the network (the parameter is set per measurement event defined for cells on a specific carrier frequency). | Treselection-cell reselection timer [s] value, needs to expire after the serving cell is better ranked than neighbour cell to trigger the reselection (the parameter can be set per NR frequency). |
| Hysteresis-hysteresis parameter [dB], ensures that Event A3 is not reported until the RSRP difference between the serving and the neighbour cell is equal to the hysteresis. | Qhyst-hysteresis parameter [dB] added to the RSRP measurement of the serving cell, ensures that cell reselection is not triggered until the RSRP difference between the serving and the neighbour cell is equal to the hysteresis. |
| Cell individual offset- offset parameter [dB], added to RSRP measurement of neighbour cel l(optional). | Qoffset-offset parameter [dB], added to RSRP measurement of neighbour cell (optional)-defined per cell. |

Figure 4:
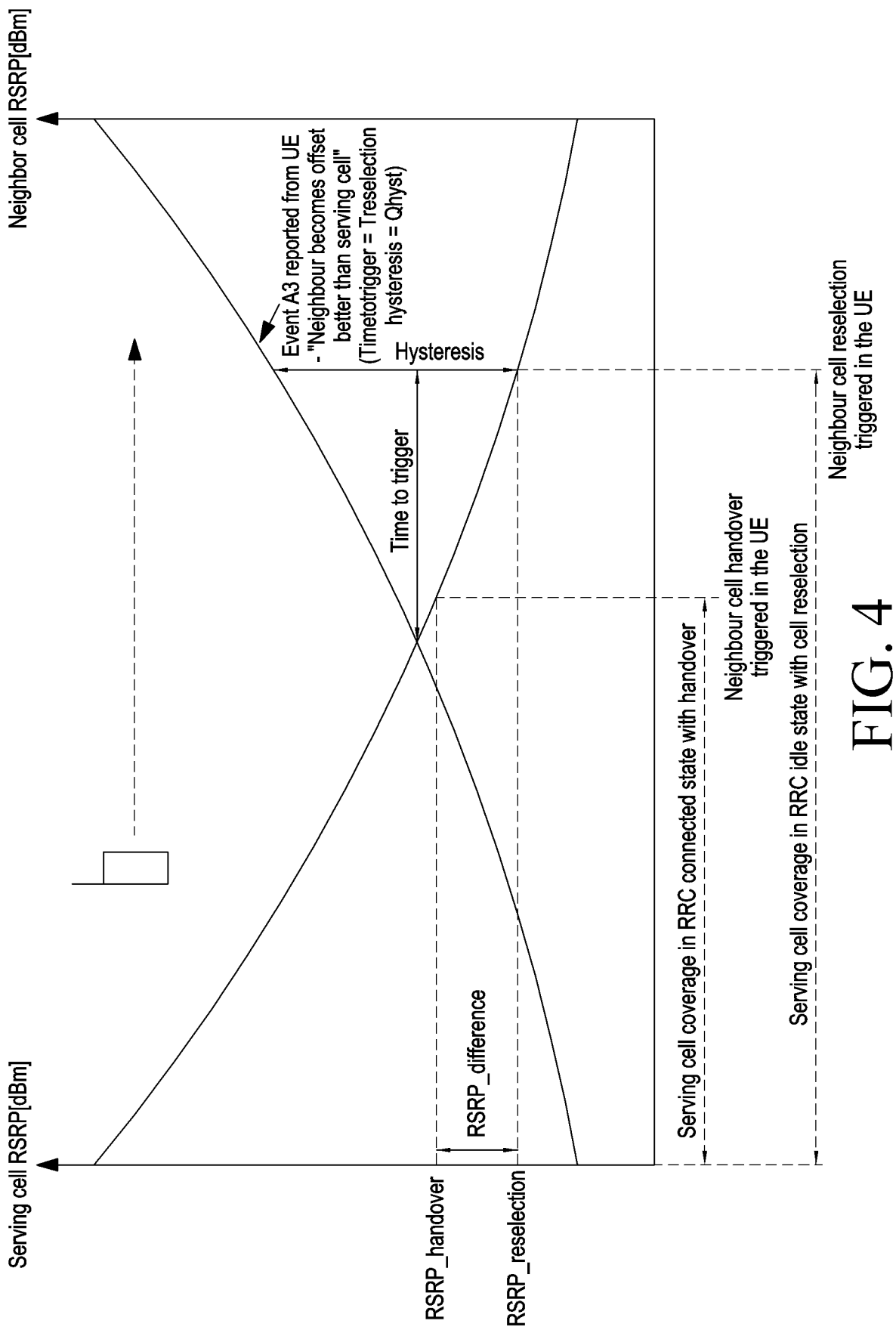
FIG. 4 schematically depicts a method according to an exemplary embodiment of joint cross-state (RRC connected vs idle) mobility optimization in the UE based on the measurement event A3 emulating cell reselection.

In the connected state, the UE would be able to emulate the "artificial" cell reselection using Event A3 configured with additional idle state parameters as defined in Table 2. Based on the triggering and reporting of such configured Event A3, the UE during the handover procedure is able to detect when there is a misalignment with the cell reselection. When detecting and reporting the misalignment, the UE is also able to store the measured serving cell result (e.g. RSRP) as follows (see FIG. 4 for details):

RSRP_handover for a handover in the connected state
RSRP_reselection for a cell reselection in the idle state FIG. 4 schematically depicts a method according to an exemplary embodiment of joint cross-state (RRC connected vs idle) mobility optimization in the UE based on the measurement event A3 emulating cell reselection. Cell individual offset and Qoffset as optional parameters are assumed undefined and are not shown in FIG. 4. In more detail, FIG. 4 shows coverage misalignment between connected and idle state mobility and related reselection and handover parameters with RSRP_difference interpretation.

Those values could be then used to find RSRP_difference using the following equation 1:

RSRP_difference=RSRP_handover−RSRP_reselection    [equation 1]

RSRP_difference [dB] is the parameter which describes how big is the difference in serving cell coverage between the connected and the idle state. It is illustrated in FIG. 4, The bigger the measured RSRP_difference value, the higher the possibility of connected/idle state mobility misalignment causing undesired mobility ping-pong behaviour or unwanted HOs (due to different cell coverage in both states). In an ideal situation, when RSRP_difference parameter is close or equal to zero, it could be expected that connected/idle state misalignment is minimized or does not exist and as a result mobility performance could be increased.

To support the coverage and mobility robustness optimization in the network, RSRP_difference parameter value could be reported to the network (see section 3.5.2 for details of the cross-state mobility robustness optimization) e.g. using dedicated RRC signaling (e.g. NR RRC MeasurementReport or similar message). This data could be then immediately reported to the related SON/AI algorithms in the network. By gathering and analysing those parameters, the network is able to optimize mobility performance by adjusting related handover (e.g. using Cell individual offset parameter defined in [TS 38.331]) or cell reselection mobility parameter (e.g. using Qoffset parameter defined in [TS 38.304]).

Figure 5:
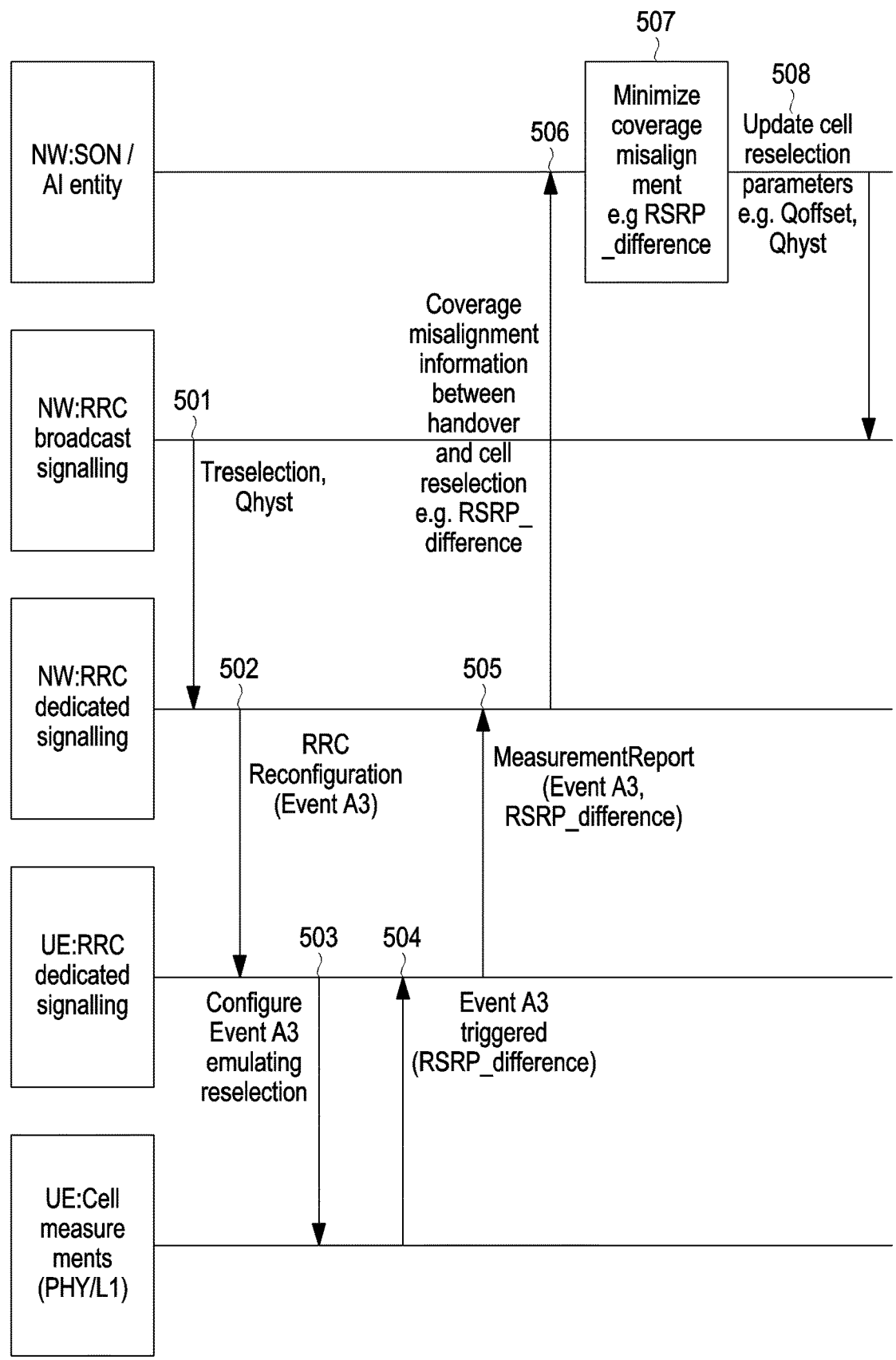
FIG. 5 schematically depicts a model according to an exemplary embodiment of the information flow between the network and the UE in the RRC connected state supporting joint cross-state (connected vs. idle) cell reselection parameters optimization based on event A3 emulating cell reselection.

The problem of the coverage misalignment between the connected and the idle state introduced in the previous section could be addressed by the following new algorithm implementing the cross-state (RRC connected vs. idle) mobility optimization in 5G NR, reducing the coverage misalignment in the cell (see FIG. 5 for details of the information flow):

FIG. 5 schematically depicts a model according to an exemplary embodiment of the information flow between the network and the UE in the RRC connected state supporting joint cross-state (connected vs. idle) cell reselection parameters optimization based on event A3 emulating cell reselection. In more detail, in one embodiment of the disclosure, event A3 triggering emulating cell reselection is performed in the UE (UE based solution), as specified in FIG. 5, as described in Section 1.2.

In step 501, Network identifies the idle state cell reselection configuration based on the RRC system information (SIB) data (Treselection, Qhyst). The Network may be the base station in a wireless communication system.

In step 502, Network using existing RRCReconfiguration message configures measurement event A3 ("Neighbour becomes offset better than serving cell") when in the connected state to detect the emulated idle state cell reselection with the following event parameters (see Table 2):
a. TimeToTrigger=Treselection
b. Hysteresis=Qhyst In step 503, Then, event A3 is configured and evaluated in the UE based on the serving and neighbour cell RSRP measurements performed in the connected state but emulating idle state measurements (with their frequency and filtering as defined in [TS 38.304])

In step 504, Event A3 emulating the cell reselection is triggered in the UE.

In step 505, When event A3 is triggered, the UE reports the measured RSRP_difference[dB] value (see section 3.5.1 for definition) to the network e.g. in the existing RRC MeasurementReport message [referring to TS 38.331].

In step 506, Triggered cell reselection information is indicated to the self-organizing/AI network entity including coverage misalignment information between handover and cell reselection e.g. RSRP_difference.

In step 507, Assuming that in SON/AI algorithm N values of RSRP_difference[dB] could be reported from different UEs, network can choose 'Cell individual offset' handover parameter or 'Qoffset' reselection parameter to tune its setting and minimize the coverage misalignment. An optimization problem to minimize the averaged RSRP_difference[dB] value is defined below in the following equation 2:

$$\min_x \frac{1}{N}\sum_1^N \text{RSRP\_difference}(x)$$    [equation 2]

where:
N—number of reported values
(x=Cell individual offset)∨(x=Qoffset)
depending on the chosen handover or cell reselection tuning parameter.

In step 508, Optimized cell reselection (or handover) parameter value is updated in the RRC system information data of the cell (e.g. SIB for cell reselection or dedicated RRC signaling for handover).

In Section 1.2, a UE based solution was described using event A3 to trigger emulated cell reselection in the UE. An alternative implementation is a network based solution, when the cell reselection emulation is performed in the network based on the actual serving and neighbouring cell measurements (not measurement event A3 as in UE based solution) provided from the UE is described below.

The fourth aspect provides a network defining a set of cells, including a first cell and a second cell, wherein the network comprises:
  a set of user equipment, UE, including a first UE;
  wherein the network is configured to:
    emulate a first event of a set of events of the first UE related to the set of cells; and
    estimate a first attribute of a set of attributes of the set of cells based on a result of the emulated first event.

In one example, the emulated first event comprises and/or is a handover, HO, of the first UE from the first cell to the second cell or a cell reselection.

In one example, the network is configured to emulate, in a connected state of the first UE, the first event, wherein the first event is in an idle or inactive state of the first UE (i.e. cell reselection), for example using data, such as cells measurements as described below, obtained (i.e. extracted) by the first UE in the connected state.

In one example, the network is configured to emulate, in an idle or inactive state of the first UE, the first event, wherein the first event is in a connected state of the first UE (i.e. handover), for example using data, such as measured as described below, obtained (i.e. extracted) by the first UE in the idle or inactive state.

In one example, the network is configured to initiate the first event (e.g. the actual HO event or the actual cell reselection event). In one preferred example, the network is configured to initiate the first event, wherein the first event is a cell reselection, of the first UE, from the first cell to the second cell.

In one example, the network is configured to obtain such as receive from the first UE and/or determine, for example measure, an emulated first channel load metric of a set of emulated channel load metrics related to the emulated first event, for example wherein the emulated first channel load metric comprises and/or is a radio signal, for example a CBR, a Reference Signal Strength Indicator, RSSI, a Reference Signal Received Power, RSRP, a Reference Signal Received Quality, RSRQ, a latency, a bitrate and/or a data buffer occupancy rate.

In one example, the network is configured to obtain such as receive from the first UE and/or to determine, for example measure, an actual first channel load metric of a set of channel load metrics related to the initiated first event, for example wherein the actual first channel load metric comprises and/or is a radio signal, for example a CBR, a Reference Signal Strength Indicator, RSSI, a Reference Signal Received Power, RSRP, a Reference Signal Received Quality, RSRQ, a latency, a bitrate and/or a data buffer occupancy rate.

In one example, the network is configured to compare the emulated first channel load metric and the actual first channel load metric.

In one example, the network is configured to report the compared emulated first channel load metric and the actual first channel load metric.

In one example, the network comprises a machine learning, ML, algorithm and wherein the ML algorithm is trained using the compared emulated first channel load metric and the actual first channel load metric.

In one example, the network is configured to control an operation thereof using the trained ML algorithm and/or a Self Organising Network, SON, algorithm.

In one example, the network is configured to emulate the first event as an idle state event of the first UE.

In one example, the first attribute comprises and/or is a coverage misalignment severity.

In one example, the network is configured to map an existing connected state event of the first UE to a corresponding idle event of the first UE.

In one example, the network is configured to map existing connected state event parameters of the first UE to corresponding idle event parameters of the first UE.

The network according to the first aspect may be configured to implement any of the steps as described with respect to the first aspect, the second aspect, the third aspect, the fifth aspect and/or described herein.

The fifth aspect provides a method comprising:

emulating, by network, a first event of a set of events related a set of cells, including a first cell and a second cell, defined by the network of a first user equipment, UE, of a set of UE; and estimating, by the network, a first attribute of a set of attributes of the set of cells based on a result of the emulated first event.

The method according to the fifth aspect may include any of the steps as described with respect to the first aspect, the second aspect, the third aspect, the fourth aspect and/or described herein.

In another embodiment of the disclosure where emulated cell reselection is performed in the NW (NW based solution), as described below with reference to FIG. 6 and/or FIG. 7.

Figure 6:
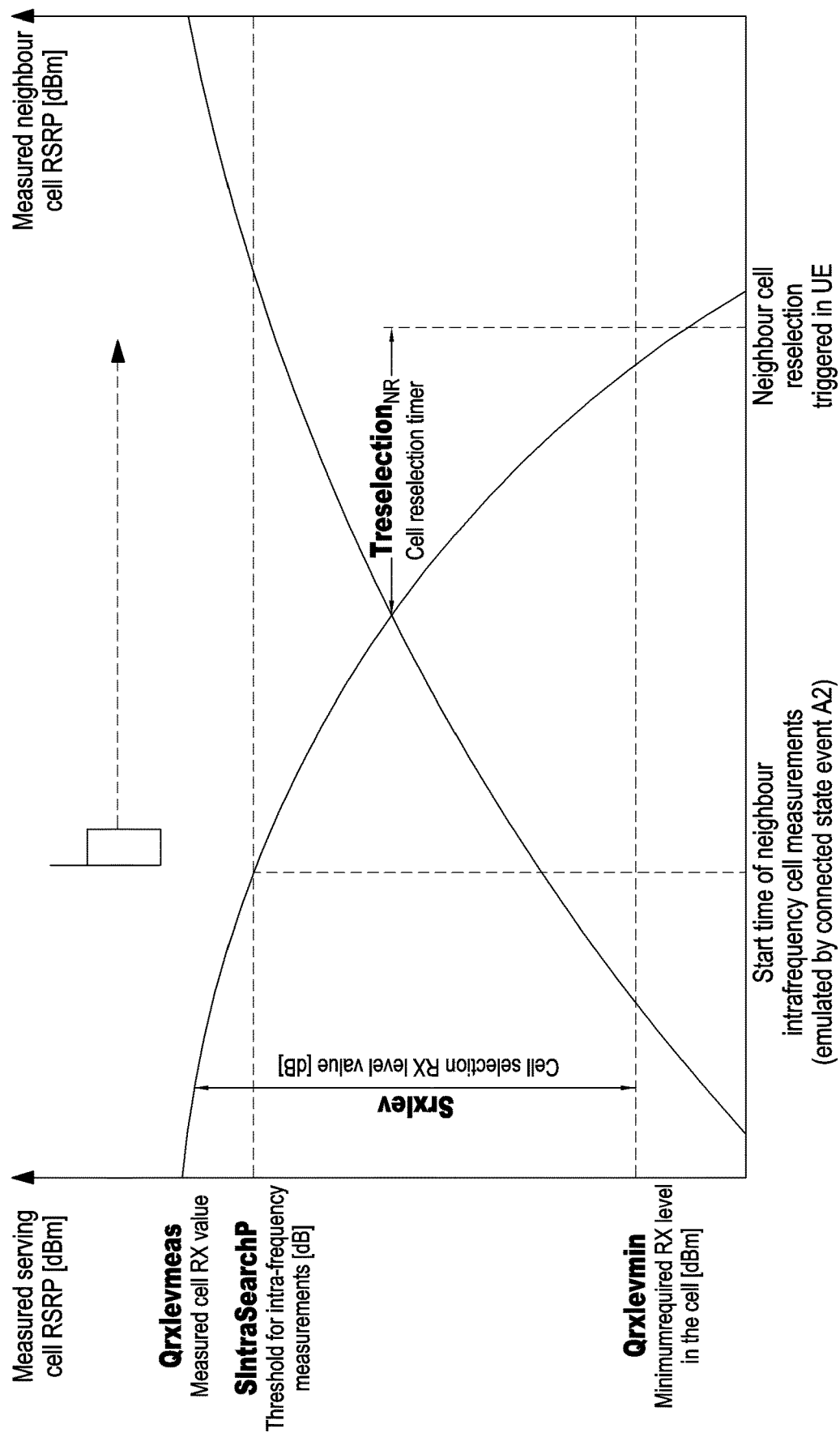
FIG. 6 schematically depicts a model according to an exemplary embodiment of the idle state neighbour cells measurements start emulated in the connected state by Event A2.

The problem of the coverage misalignment between the connected and the idle state introduced in the previous sections could be addressed by the following new algorithm implementing the joint cross-state (RRC connected vs. idle) mobility optimization in 5G NR, reducing the coverage misalignment in the cell (see FIG. 6 for details of the information flow).

FIG. 6 schematically depicts a model according to an exemplary embodiment of the idle state neighbour cells measurements start emulated in the connected state by Event A2. The main difference with the UE based solution presented in the previous section is that rather than using measurement event trigger based approach in the UE to pass the neighbouring cell measurements context to the network, actual periodic serving and neighbour cell measurements are sent and actual cell reselection evaluation and emulation is performed in the network.

However in the network based solution, another RRC measurement event A2 (Serving becomes worse than absolute threshold) defined in [TS 38.331] is used to emulate the start (or stop) of neighbor cell measurements as shown in FIG. 6.

Details of the algorithm are described below and depicted on FIGS. 7A and 7B (NOTE: For simplicity connected state handover signaling performed in parallel is not shown.)

Figure 7A:
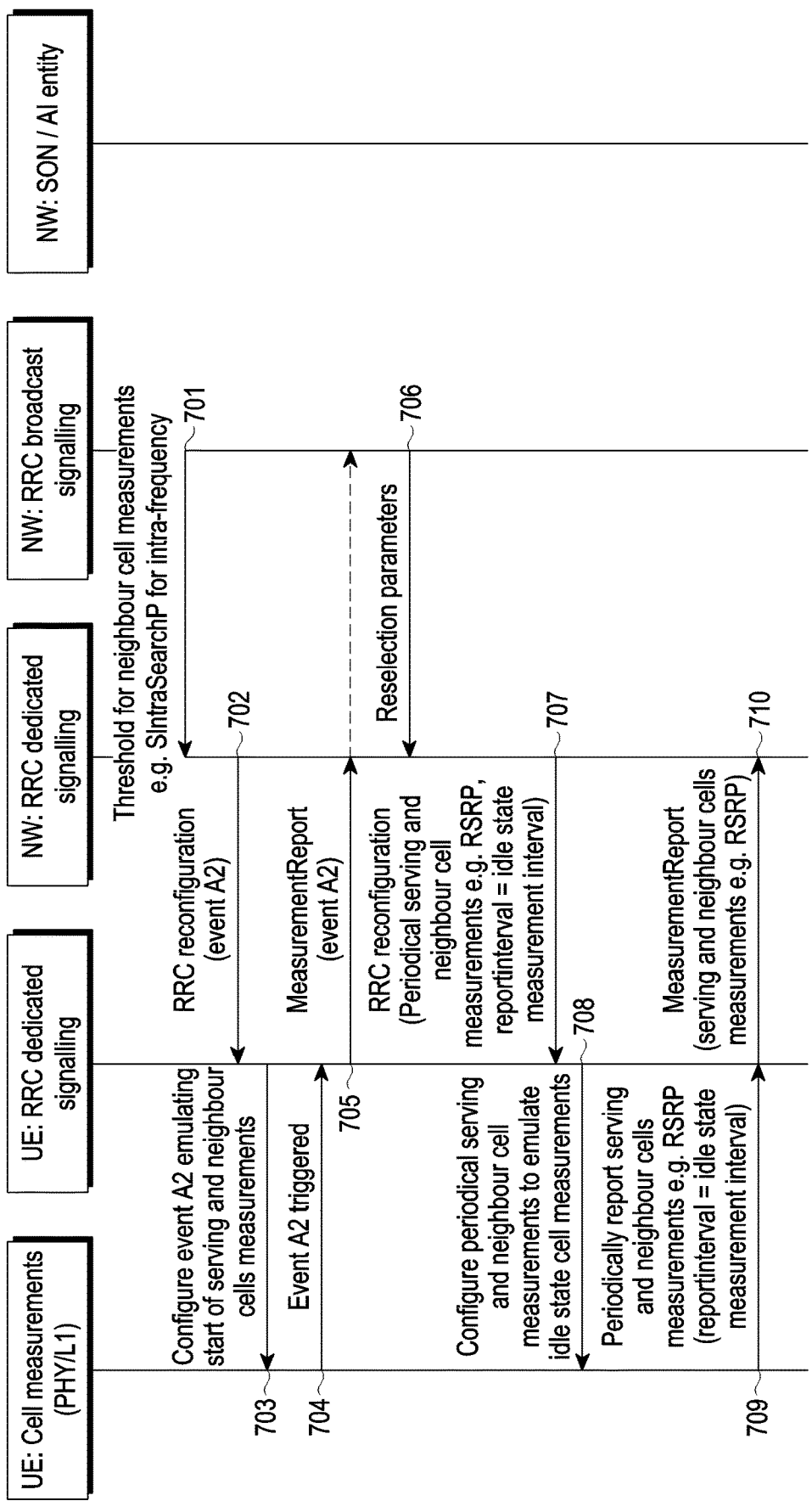
FIGS. 7A and 7B schematically depicts a model according to an exemplary embodiment of the information flow between the network and the UE in the RRC connected state supporting joint cross-state (connected vs. idle) cell reselection parameters optimization based on emulating cell reselection in the network.
Figure 7B:
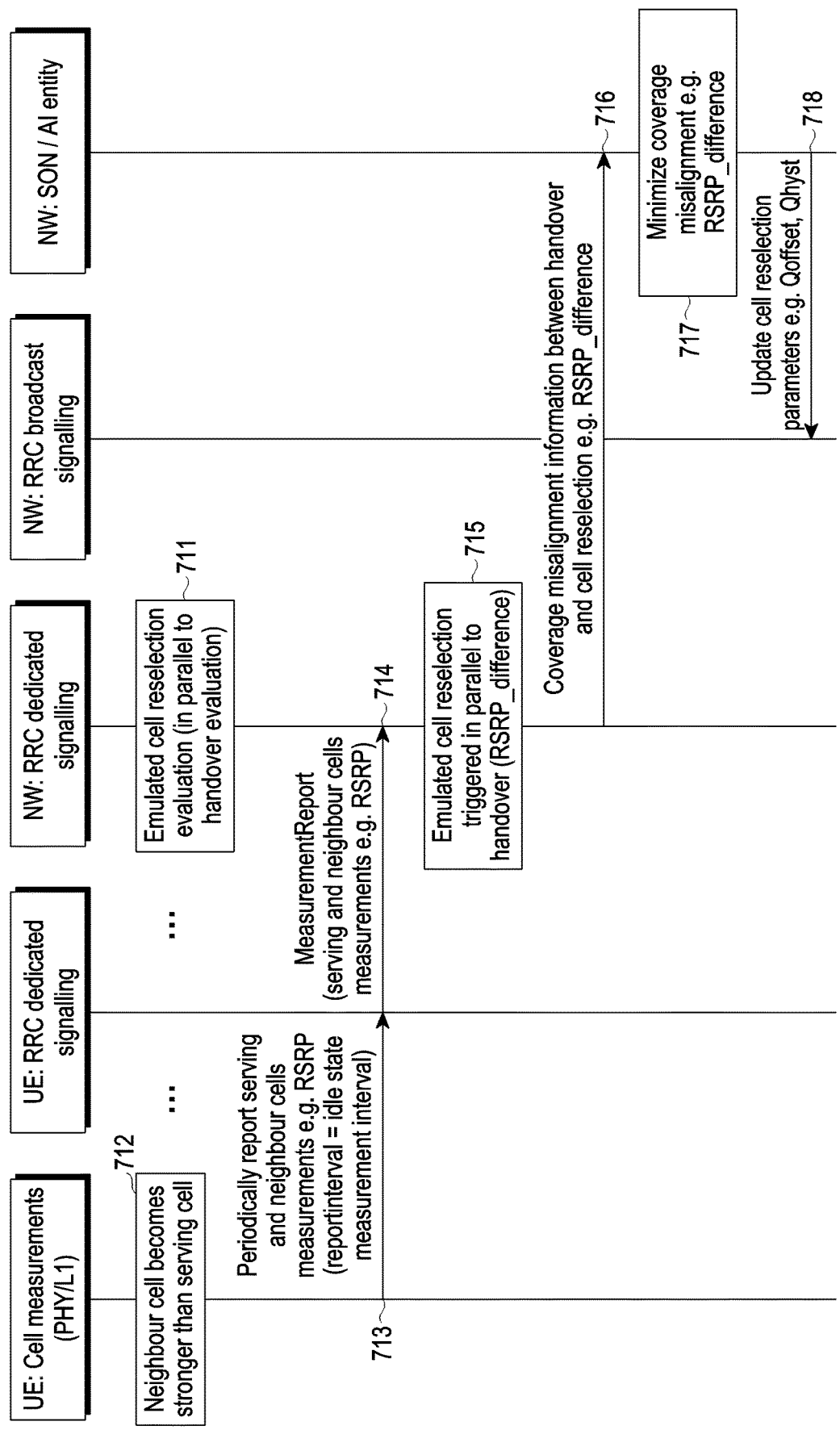

FIGS. 7A and 7B schematically depicts a model according to an exemplary embodiment of the information flow between the network and the UE in the RRC connected state supporting joint cross-state (connected vs. idle) cell reselection parameters optimization based on emulating cell reselection in the network. Handover related signaling is not shown in FIG. 7.

In step 701, Network (in the UE RRC connected state) identifies the idle state cell reselection measurements configuration based on the RRC system information (SIB) data (e.g. SintrasearchP, Qrxlevmin, frequencies and cells to be measured) as defined in [TS 38.304]. The Network may be the base station in a wireless communication system.

In step 702, Network configures Event A2 in the UE by using RRC message e.g. RRCReconfiguration [referring to TS 38.331]

In step 703, Connected state Event A2 evaluation is performed in the UE physical layer (PHY/L1) to emulate start of serving and neighbour cells measurements in the idle state.

In step 704, Event A2 is triggered in the connected state when serving cell become worse than SintrasearchP measurement threshold (idle state parameter).

In step 705, Triggered Event A2 is reported by the UE to the network by using RRC message e.g. Measurement Report [referring to TS 38.331]

In step 706, Network identifies remaining idle state parameters required for cell reselection evaluation (see Table 1) if not already provided in step 1.

In step 707, Network configures periodic serving and neighbour cells measurements reporting in the UE by using RRC message e.g. RRCReconfiguration. To emulate idle state measurements periodicity required for cell reselection, reporting interval (reportInterval parameter in [TS 38.331]) should be equal to idle state measurement interval.

In step 708, UE PHY/L1 configures requested periodic serving and neighbour cell measurements in the connected state.

In step 709, UE PHY/L1 periodically reports the requested cell measurements.

In step 710, Serving and neighbouring cells are periodically reported in RRC message e.g. MeasurementReport to the network.

In step 711, Emulated cell reselection evaluation is performed in the network (in parallel to handover decision evaluation) based on the received measurements In step 712, Neighbour cell becomes stronger than the serving cell.

In step 713, UE PHY/L1 reports the requested cell measurements with a neighbour cell stronger than the serving cell In step 714, Serving and neighbouring cells (including the stronger neighbour cell) are periodically reported in RRC message e.g. MeasurementReport to the network.

In step 715, Emulated cell reselection is triggered in parallel to the cell handover decision and RSRP_difference is calculated.

In step 716, Triggered cell reselection information is indicated to the self-organizing/AI network entity including coverage misalignment information between handover and cell reselection e.g. RSRP_difference.

In step 717, Minimization of coverage misalignment is performed e.g. by minimization of RSRP_difference as described in the formula introduced in Section 1.2.

In step 718, Optimized cell reselection (or handover) parameter value is updated in the RRC system information data of the cell (e.g. SIB for cell reselection).

It is understood by a person skilled in the art that steps 711 and 715 above can be optionally done in the SON/AI entity as well, in which case the parameters obtained in step 14 shall be passed to the SON/AI entity.

It is also understood by a person skilled in the art that the SON/AI entity can be mapped to a network component that is based on a 3GPP based network architecture, where the SON/AI entity can be the SON component defined in RAN WG3. It can also be based on a network architecture such as O-RAN, in which case the SON/AI entity may be considered as the near-RT RIC or Real-time RIC in an O-RAN architecture, and NW in FIGS. 7A and 7B is the E2 nodes in an O-RAN system.

In embodiments of the present disclosure, the UE and the base station may be implemented by including a processor controlling operations according to the method according to at least one of the embodiments of FIGS. 1 to 7 and a transceiver for transmitting and receiving signals.

Although a preferred embodiment has been shown and described, it will be appreciated by those skilled in the art that various changes and modifications might be made without departing from the scope of the disclosure, as defined in the appended claims and as described above.

The disclosure have analysed coverage misalignment caused by differences in the mobility functions defined in 5G RRC connected (handover) and idle/inactive (cell reselection) states, which is critical for V2X use cases as latency requirements become stringent. The inventors have introduced a novel MRO framework based on the concept of UE emulating idle state reselection while being in the connected state and defined its integration in the O-RAN architecture. Advantages of the disclosure include is its applicability to 3/4/5G, intra/inter-frequency and inter-RAT mobility, other SON use cases and/or ability to provide faster, more precise and efficient data for the AI assisted cell reselection parameters optimisation than legacy methods e.g. based on the Minimization of Drive-Tests [referring to TS 37.320].

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims and drawings), and/or all of the steps of any method or process so disclosed, may be combined in any combination, except combinations where at most some of such features and/or steps are mutually exclusive.

Each feature disclosed in this specification (including any accompanying claims, and drawings) may be replaced by alternative features serving the same, equivalent or similar purpose, unless expressly stated otherwise. Thus, unless expressly stated otherwise, each feature disclosed is one example only of a generic series of equivalent or similar features.

The disclosure is not restricted to the details of the foregoing embodiment(s). The disclosure extends to any novel one, or any novel combination, of the features disclosed in this specification (including any accompanying claims and drawings), or to any novel one, or any novel combination, of the steps of any method or process so disclosed.

What is claimed is:

1. A user equipment (UE) in a wireless communication system, the UE comprising:
    a transceiver; and
    a processor comprising processor circuitry configured to:
        emulate a first event of a set of events related to a set of cells including a serving cell and a neighbor cell in case that the UE is in a radio resource control (RRC) connected state and the first event is triggered in the UE,
        determine an emulated first channel load metric of a set of emulated channel load metrics related to the emulated first event, the emulated first channel load metric including a reference signal received power (RSRP) for a cell reselection from the serving cell to the neighbor cell,
        determine an actual first channel load metric of the set of the emulated channel load metrics related to the emulated first event, the actual first channel load metric including a RSRP for a handover from the serving cell to the neighbor cell,
        identify a difference between the emulated first channel load metric and the actual first channel load metric, the difference being proportional to a coverage misalignment severity for the serving cell or the neighbor cell associated with measurements for the cell reselection or the handover of the UE, and
        report, to a base station, information about the identified difference between the emulated first channel load metric and the actual first channel load metric, wherein the emulated first event comprises the cell reselection of the UE from the serving cell to the neighbor cell.

2. The UE of claim 1, wherein the processor is configured to receive, from the base station, configuration information for the first event, and initiate the first event based on the configuration information.

3. The UE of claim 1, wherein the emulated first channel load metric further comprises at least one of a channel busy ratio (CBR), a reference signal strength indicator (RSSI), a reference signal received quality (RSRQ), a latency, a bitrate or a data buffer occupancy rate.

4. The UE of claim 1, wherein the processor is configured to map an existing connected state event of the handover to an idle event of the cell reselection.

5. The UE of claim 4, wherein the processor is configured to map parameters of the existing connected state event to parameters of the idle stated event.

6. A method of user equipment (UE) in a wireless communication system, the method comprising:
 emulating, by the UE, a first event of a set of events related to a set of cells, a serving cell and a neighbor cell in case that the UE is in a radio resource control (RRC) connected state and the first event is triggered in the UE;
 determining an emulated first channel load metric of a set of emulated channel load metrics related to the emulated first event, the emulated first channel load metric including a reference signal received power (RSRP) for a cell reselection from the serving cell to the neighbor cell;
 determining an actual first channel load metric of a set of the emulated channel load metrics related to the emulated first event, the actual first channel load metric including a RSRP for a handover from the serving cell to the neighbor cell;
 identifying a difference between the emulated first channel load metric and the actual first channel load metric, the difference being proportional to a coverage misalignment severity for the serving cell or the neighbor cell associated with measurements for the cell reselection or the handover of the UE; and
 reporting, to a base station, information about the identified difference between the emulated first channel load metric and the actual first channel load metric,
 wherein the emulated first event comprises the cell reselection of the UE from the serving cell to the neighbor cell.

7. The method of claim 6, further comprising receive, from the base station, configuration information for the first event,
 wherein the first event is initiated based on the configuration information by the UE.

8. The method of claim 6, wherein the emulated first channel load metric further comprises at least one of a channel busy ratio (CBR), a reference signal strength indicator (RSSI), a reference signal received quality (RSRQ), a latency, a bitrate or a data buffer occupancy rate.

9. The method of claim 6, wherein an existing connected state event of the handover is mapped to an idle state event of the cell reselection.

10. The method of claim 9, wherein parameters of the existing connected state event are mapped to parameters of the idle state event.

11. A base station in a wireless communication system, the base station comprising:
 a transceiver; and
 a processor comprising processor circuitry configured to:
  transmit, to a user equipment (UE), configuration information for a first event of a set of events related to the set of cells including a serving cell and a neighbor cell of the UE,
  receive, based on the configuration information, from the UE in a radio resource control (RRC) connected state, information about a difference between an emulated first channel load metric and an actual first channel load metric, the difference being proportional to a coverage misalignment severity for the serving cell or the neighbor cell associated with measurements for a cell reselection or a handover of the UE, and
  update parameters for the cell reselection or the handover by training a machine learning (ML) algorithm using the information about the difference associated with the first event emulated in the UE,
 wherein the emulated first channel load metric includes a reference signal received power (RSRP) for the cell reselection from the serving cell to the neighbor cell, and the actual first channel load metric includes a RSRP for the handover from the serving cell to the neighbor cell,
 wherein the information about the difference between the emulated first channel load metric and the actual first channel load metric is received based on the emulated first event, and
 wherein the emulated first event comprises the cell reselection of the UE from the serving cell to the neighbor cell.

12. The base station of claim 11, wherein the processor is configured to control an operation using at least one of the trained ML algorithm or a self organizing network (SON) algorithm.

13. The base station of claim 11, wherein the emulated first channel load metric comprises at least one of a channel busy ratio (CBR), a reference signal strength indicator (RSSI), a reference signal received quality (RSRQ), a latency, a bitrate or a data buffer occupancy rate.

14. A method of a base station in a wireless communication system, the method comprising:
 transmit, to a user equipment (UE), configuration information for a first event of a set of events related to the set of cells including a serving cell and a neighbor cell of the UE;
 receiving, based on the configuration information, from the UE in a radio resource control (RRC) connected state, information about a difference between an emulated first channel load metric and an actual first channel load metric, the difference being proportional to a coverage misalignment severity for the serving cell or the neighbor cell associated with measurements for a cell reselection or a handover of the UE; and
 updating parameters for the cell reselection or the handover by training a machine learning (ML) algorithm using the information about the difference associated with the first event emulated in the UE,
 wherein the emulated first channel load metric includes a reference signal received power (RSRP) for the cell reselection from the serving cell to the neighbor cell, and the actual first channel load metric includes a RSRP for the handover from the serving cell to the neighbor cell, wherein the information about the difference between the emulated first channel load metric and the actual first channel load metric is received based on the emulated first event, and wherein the emulated first event comprises a cell reselection of the UE from the serving cell to the neighbor cell.

15. The method of claim 14, wherein the base station controls an operation using at least one of the trained ML algorithm or a self organizing network (SON) algorithm.

16. The method of claim 14, wherein the emulated first channel load metric comprises at least one of a channel busy ratio (CBR), a reference signal strength indicator (RSSI), a reference signal received quality (RSRQ), a latency, a bitrate or a data buffer occupancy rate.

\* \* \* \* \*